US008004914B2

(12) United States Patent
Cha et al.

(10) Patent No.: US 8,004,914 B2
(45) Date of Patent: Aug. 23, 2011

(54) METHOD OF TESTING NONVOLATILE MEMORY DEVICE

(75) Inventors: Jae Won Cha, Seoul (KR); Duck Ju Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 232 days.

(21) Appl. No.: 12/400,055

(22) Filed: Mar. 9, 2009

(65) Prior Publication Data

US 2009/0225611 A1    Sep. 10, 2009

(30) Foreign Application Priority Data

Mar. 10, 2008  (KR) .................. 10-2008-0021949

(51) Int. Cl.
*G11C 29/00*    (2006.01)
(52) U.S. Cl. ....................... 365/201; 365/200
(58) Field of Classification Search .......... 365/200, 365/201
See application file for complete search history.

(56) References Cited

U.S. PATENT DOCUMENTS

| 7,558,114 B2* | 7/2009 | Lee et al. ............ 365/185.18 |
|---|---|---|
| 7,567,460 B2* | 7/2009 | Chae et al. .......... 365/185.18 |
| 7,609,553 B2* | 10/2009 | Hwang .............. 365/185.17 |
| 2004/0240268 A1* | 12/2004 | Kim et al. ........... 365/185.09 |
| 2005/0162918 A1* | 7/2005 | Kim et al. ........... 365/185.22 |
| 2006/0053353 A1* | 3/2006 | Youn et al. ............ 714/718 |
| 2007/0025159 A1* | 2/2007 | Lee et al. ............ 365/185.24 |
| 2009/0040836 A1* | 2/2009 | Lee ..................... 365/185.22 |
| 2009/0231927 A1* | 9/2009 | Cha et al. ........... 365/185.22 |
| 2010/0195401 A1* | 8/2010 | Jeong et al. ......... 365/185.19 |

FOREIGN PATENT DOCUMENTS

| KR | 1020060092329 A | 8/2006 |
|---|---|---|
| KR | 1020060124009 A | 12/2006 |
| KR | 1020070105141 A | 10/2007 |

OTHER PUBLICATIONS

Notice of Allowance issued from Korean Intellectual Property Office on Nov. 6, 2009.

* cited by examiner

*Primary Examiner* — Son T Dinh
*Assistant Examiner* — Hien N Nguyen
(74) *Attorney, Agent, or Firm* — IP & T Group LLP

(57) ABSTRACT

A method includes performing test bit setting; programming a first page using data set by the test bit setting, and storing a fail status bit in a page buffer, which is connected to a first bit line having a fail status, based on a verification result of the test program; performing a test program and verification on a second page based on a test program and fail status bit storage result of a preceding page, and storing a fail status bit in the page buffer, which is connected to a second bit line having a fail status, based on a verification result of the test program and verification; and after a test program, verification, and fail status bit setting with respect to the entire pages of a memory block are completed, outputting data of the page buffer.

13 Claims, 6 Drawing Sheets

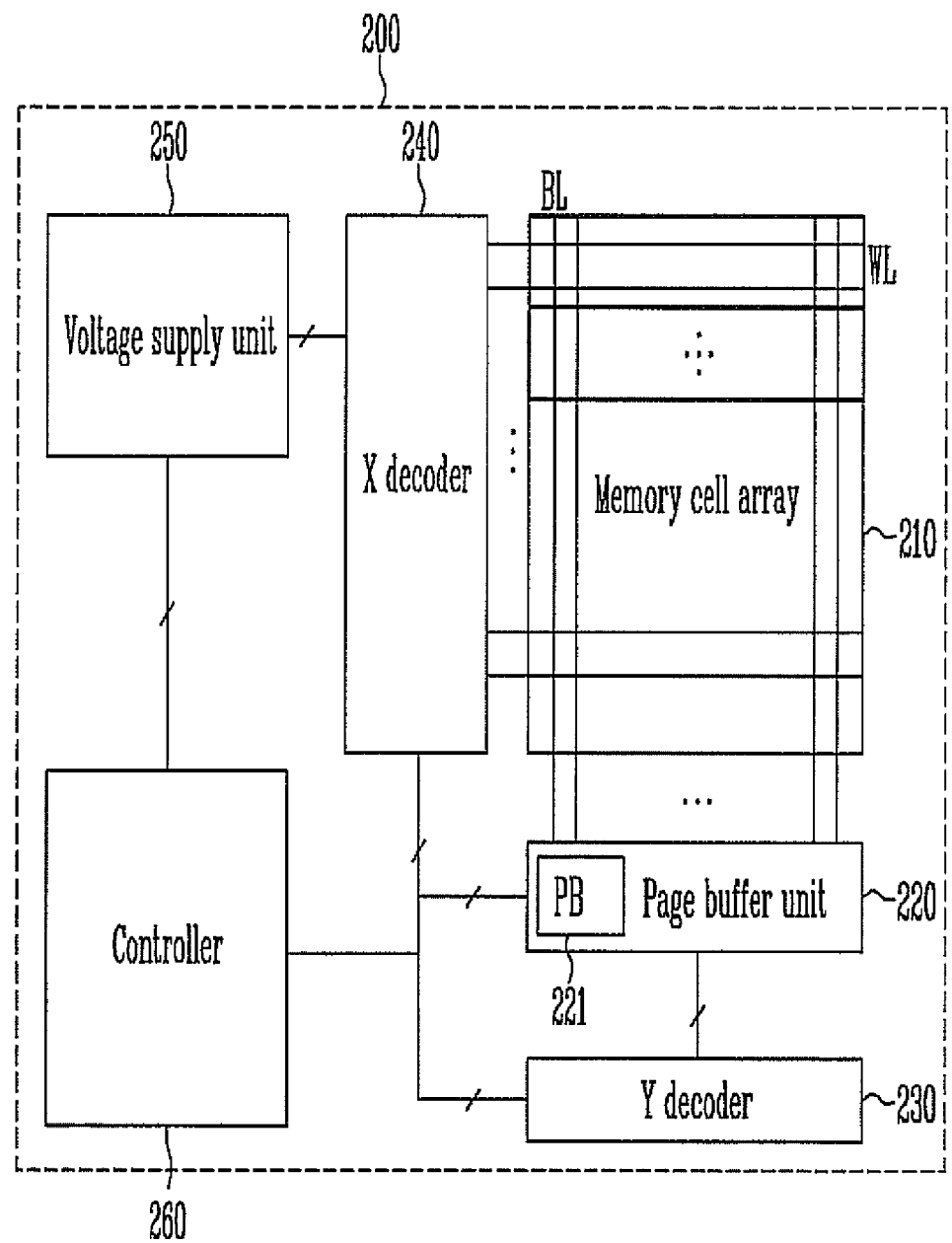

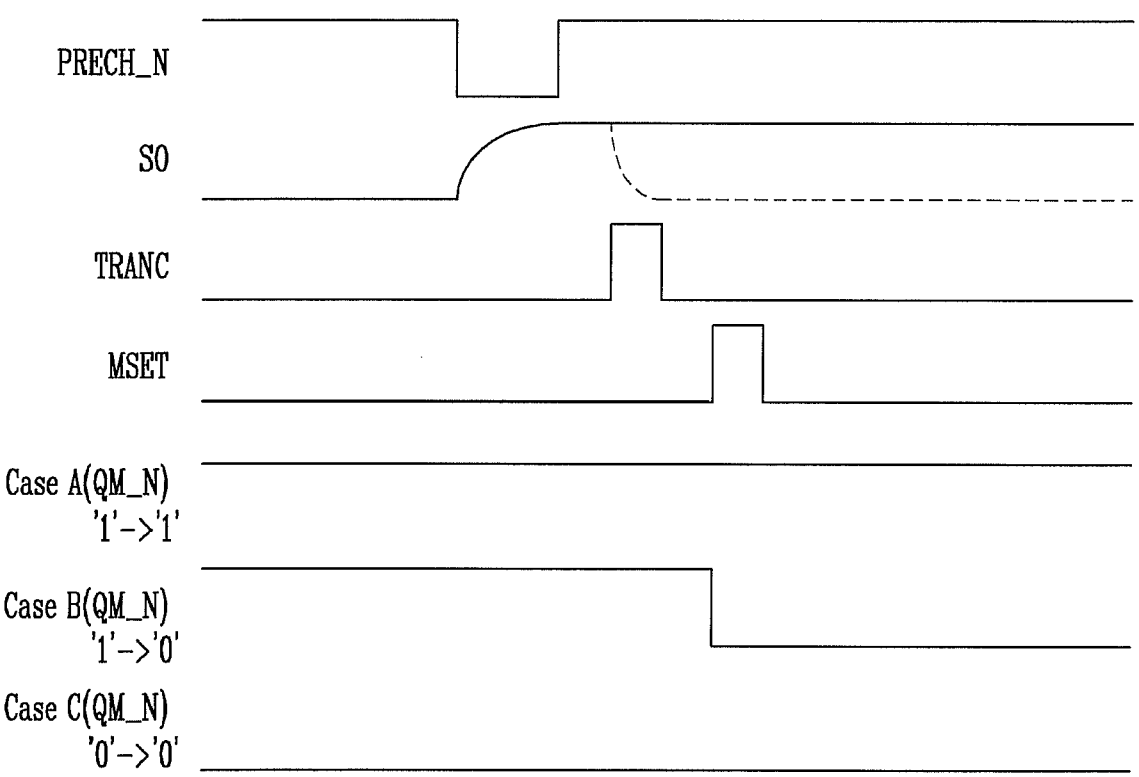

… … …

METHOD OF TESTING NONVOLATILE MEMORY DEVICE

CROSS-REFERENCES TO RELATED APPLICATIONS

The present application claims priority to Korean patent application number 10-2008-0021949, filed on Mar. 10, 2008, which is incorporated by reference in its entirety.

BACKGROUND OF THE INVENTION

The present invention relates to a test of a nonvolatile memory device and, more particularly, to a method of testing a nonvolatile memory device, in which after a program is performed on the entire pages, fail status bit information is output on a memory-block basis.

Flash memory, i.e., nonvolatile memory, is generally classified into NAND flash memory and NOR flash memory. NOR flash memory has a structure in which respective memory cells are connected to bit lines and word lines independently and therefore has an excellent random access time characteristic, whereas NAND flash memory has a structure in which a plurality of memory cells is connected in series and only one contact is required on a per cell-string basis and is therefore excellent in the degree of integration. Thus, the NAND structure is usually used in high-integrated flash memory.

A well-known NAND flash memory device includes a memory cell array, a row decoder, and a page buffer. The memory cell array is comprised of a plurality of word lines extending in rows, a plurality of bit lines extending in columns, and a plurality of cell strings, each corresponding to bit lines.

This nonvolatile memory device performs a test for determining whether an operation of a memory cell is normal in order to operate a chip normally. When a memory device operates, a normal (pass) status may result when reading data, but a fail status may result when the state of the data is checked. Accordingly, a repair operation is performed on a column having a faulty memory cell so that a memory device can operate normally.

In the case in which a normal pass status results at the time of data reading, but a fail status results at the time of state check, a repair operation has to be performed using a state bit screen operation.

FIG. 1 is an operation flowchart showing a general flash memory device.

Referring to FIG. 1, when an operation begins in test mode (S101), a program operation is performed on a page basis (S103). Program data is read into a page buffer and the data read into the page buffer is scanned (S105). Pass or fail status is determined according to the result of the page buffer scan (S107).

The program operation and the page buffer scan on a page basis are performed on the entire pages, respectively. If the program and scan operations are performed up to the last page (S109), the test is finished.

The state bit screen operation is used as a combination of an algorithm for an operation command and a test bit to be programmed into a page. The state bit screen operation wastes a lot of test time since, after data of a page buffer is output for every page, the output data has to be checked.

BRIEF SUMMARY OF THE INVENTION

The present invention is directed towards a method of testing a nonvolatile memory device, in which in testing a memory cell of a nonvolatile memory device, data scan is performed after a program is performed on the entire memory blocks, thus saving the test time.

A method of testing a nonvolatile memory device according to an aspect of the present invention includes performing test bit setting; programming a first page using data set by the test bit setting, and storing a fail status bit in a page buffer, which is connected to a first bit line having a fail status, based on a verification result of the test program; performing a test program and verification on a second page based on a test program and fail status bit storage result of a preceding page, and storing a fail status bit in the page buffer, which is connected to a second bit line having a fail status, based on a verification result of the test program and verification; and after a test program, verification, and fail status bit setting with respect to the entire pages of a memory block are completed, outputting data of the page buffer.

The test bit setting includes setting not to reset the page buffer when test programs of the remaining pages other than the first page are performed, setting only a first bit program to be performed on the entire pages, and setting a test bit, which enables a program to be performed on the entire memory cells.

The test program of the first page includes programming a test bit, which is input to a first latch of the page buffer connected to the first page in the test bit setting, into the first page; and storing the program verification result in a second latch of the page buffer.

The storage of the fail status bit includes changing a data state of the second latch according to data stored in the first latch; resetting the first latch; and changing a data state of the first latch according to a data state stored in the second latch.

The test programs of the remaining pages other than the first page are respectively performed according to the data state of the first latch in accordance with a test program and a fail status bit storage result of a preceding page.

The output of the data of the page buffer includes outputting data of the first latch.

A fail status bit line is determined and repair is performed, based on the output data.

A method of testing a nonvolatile memory device according to another aspect of the present invention includes, in performing a test program and verification on the entire pages of a memory block, programming an input test bit with respect to a first page, and performing a test program and verification based on test bit program and fail status bit storage results of preceding pages and fail status bit storage with respect to each of subsequent pages; and after a test program and verification and fail status bit setting are completed with respect to a last page of the memory block, outputting data of a page buffer.

In the test program, a test program and verification of a first page includes inputting a test bit to a first latch of the page buffer and performing program and verification; and storing the program verification result in a second latch of the page buffer.

The fail status bit setting according to the test verification result of the first page is performed, and program, verification and fail status bit storage are performed with respect to each of the subsequent pages according to set fail status bit data.

The test program includes performing only a program on a first logical page of a memory cell.

A fail status bit line is determined and repair is performed, based on the output data.

A method of testing a nonvolatile memory device according to another aspect of the present invention includes performing test bit setting; performing a first page program using data set by the test bit setting, and fixing data of a page buffer, which is connected to a first bit line having a fail status, to a fail status bit based on a verification result of the test program; performing a test program and verification of a second page with respect to the remaining bit lines other than a bit line in which data of the page buffer is fixed to a fail status bit based on test program and fail status bit storage results of preceding page buffers, and storing a fail status bit in a page buffer connected to a second bit line having a fail status based on the verification result; and after the test program and verification and the fail status bit fixing with respect to the entire pages of a memory block are completed, outputting data of the page buffer.

BRIEF DESCRIPTION OF THE DRAWINGS

FIG. 2A is a block diagram showing a flash memory device;

FIG. 4A is a timing diagram showing a first test check process of FIG. 3; and

DESCRIPTION OF SPECIFIC EMBODIMENT

Figure 1:
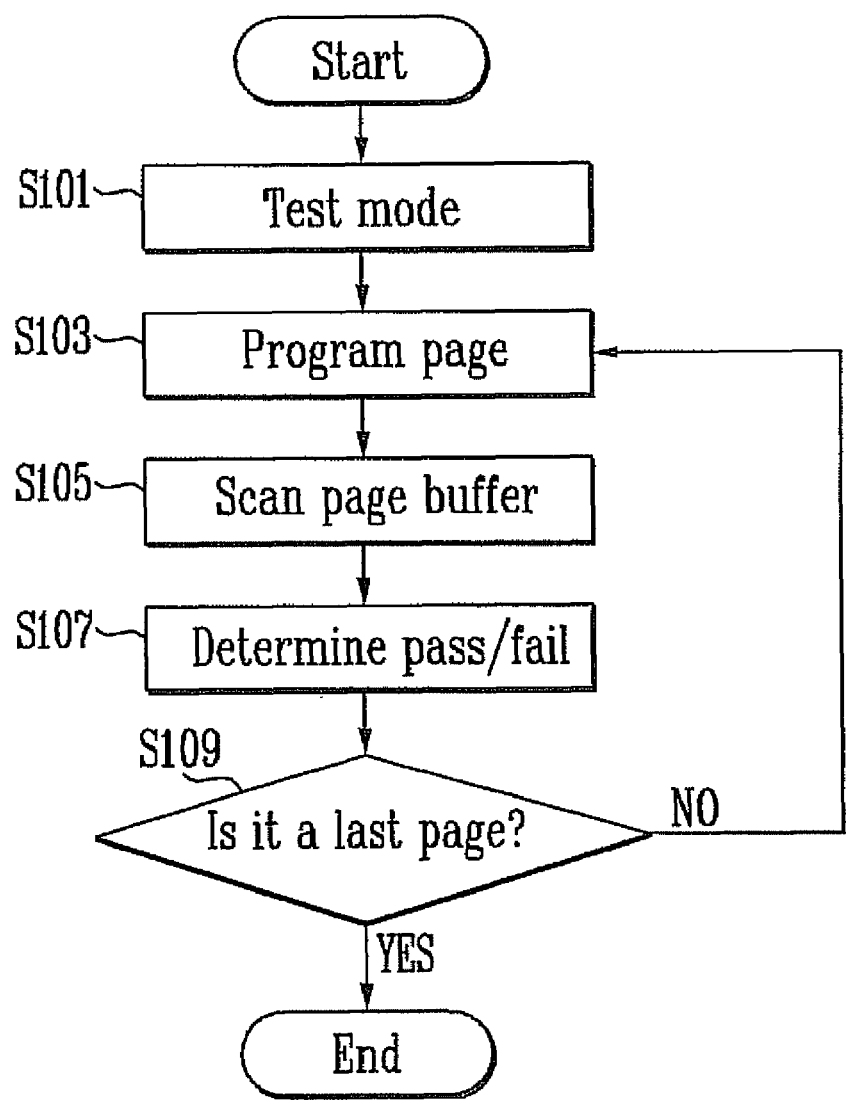
FIG. 1 is an operation flowchart for a general flash memory device.

Hereinafter, the present invention will be described in detail in connection with a specific embodiment with reference to the accompanying drawings. The present embodiment is provided to complete the disclosure of the present invention and to allow those having ordinary skill in the art to understand the scope of the present invention.

FIG. 2A is a block diagram showing a flash memory device.

Referring to FIG. 2A, a flash memory device 200 includes a memory cell array 210, a page buffer unit 220, a Y decoder 230, an X decoder 240, a voltage supply unit 250, and a controller 260.

The memory cell array 210 includes a plurality of cell strings in each of which memory cells for storing data are connected in series. Each of the cell strings is coupled to a bit line BL. A gate of the memory cell is coupled to a word line WL in a direction orthogonal to bit line.

The page buffer unit 220 includes a plurality of page buffers (PBs) 221 coupled to bit lines of the memory cell array 210. Each page buffer 221 temporarily stores data to be programmed into a selected memory cell and transfers the data to memory cell through the bit line or reads and stores data stored in a memory cell.

The Y decoder 230 offers an I/O path to the page buffer 221 of the page buffer unit 220 according to an input address, and the X decoder 240 selects a word line of the memory cell array 210 according to an input address.

The voltage supply unit 250 generates an operating voltage, which will be supplied to a word line connected by the X decoder 240, under the control of the controller 260. The controller 260 outputs a control signal according to an operation command and controls the voltage supply unit 250 such that a preset pass voltage can be supplied according to a degree in which data is programmed into the memory cell array 210.

Figure 2B:
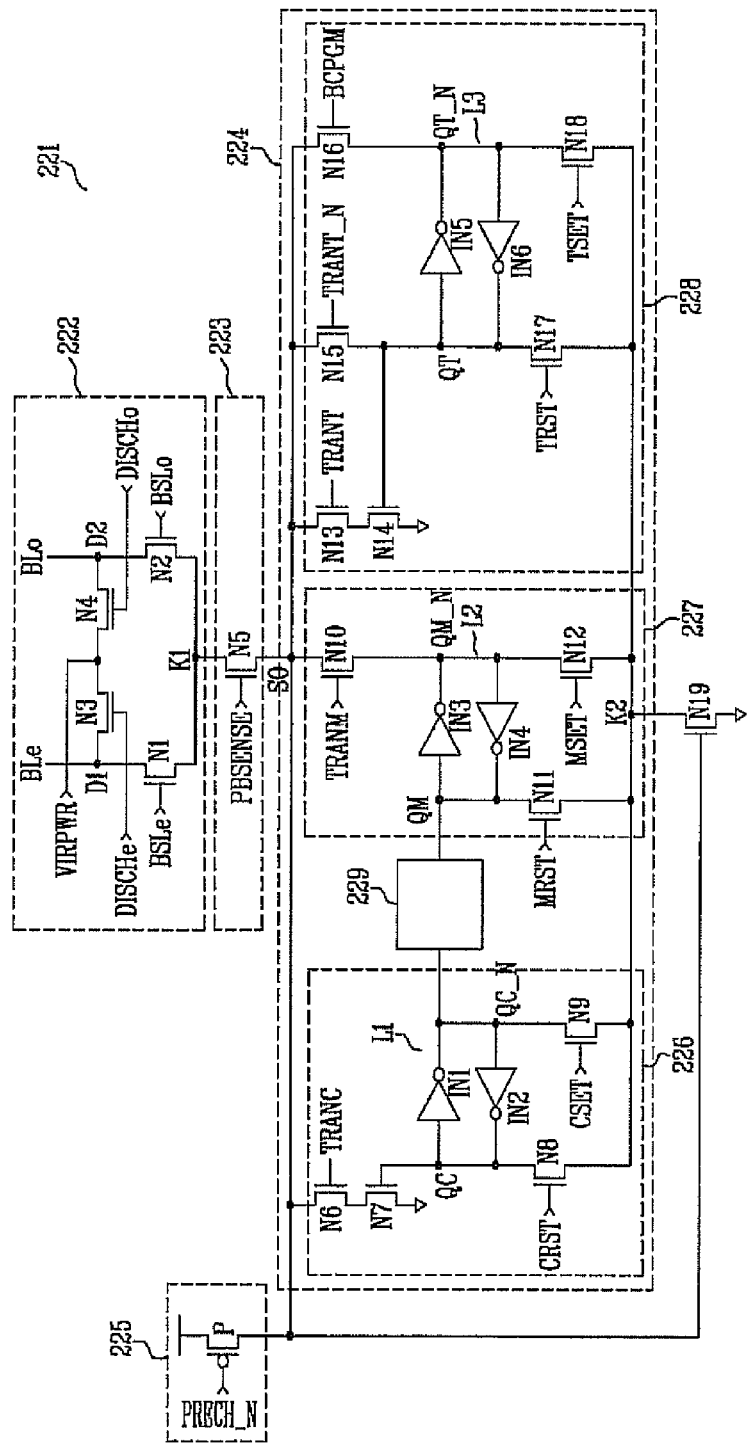
FIG. 2B is a detailed circuit diagram of a page buffer.

FIG. 2B is a detailed circuit diagram of the page buffer.

Referring to FIG. 2B, the page buffer 221 includes a bit line select unit 222, a sensing unit 223, a latch unit 224, a precharge unit 225, and a verification unit 229.

The bit line select unit 222 selects one of an even bit line BLe and an odd bit line BLo. The sensing unit 223 senses a voltage of a bit line connected thereto according to an input address when reading data. The sensing result of the sensing unit 223 is reflected in the sensing node SO.

The precharge unit 225 precharges the sensing node SO. The latch unit 224 stores data, which is stored in a memory cell, in a latch circuit according to a voltage level of the sensing node SO and stores to-be-programmed data in a latch circuit and then transfers the stored data to the sensing node SO, when the plurality of latch circuits is connected to the sensing node SO.

The latch unit 224 includes first to third latch circuit units 226 to 228. The first latch circuit unit 226 temporarily stores data for a cache program or is used to perform an Intelligent Verification operation (hereinafter referred to as an "IV operation"). Further, the second latch circuit unit 227 functions as a main latch for a program, and the third latch circuit unit 228 performs a temporary latch operation.

The verification unit 229 is connected between the first and second latch circuit units 226, 227 and outputs a verify signal for program verification.

A circuit connection of the page buffer 221 is described as follows.

The bit line select unit 222 includes first to fourth NMOS transistors N1 to N4. The sensing unit 223 includes a fifth NMOS transistor N5. The latch unit 224 includes sixth to nineteenth NMOS transistors N6 to N19 and first to sixth inverters IN1 to IN6. The precharge unit 225 includes a PMOS transistor P.

The first NMOS transistor N1 is connected between the even bit line BLe and a node K1. An even bit line select signal BSLe is input to the gate of the first NMOS transistor N1. The second NMOS transistor N2 is connected between the odd bit line BLo and the node K1. An odd bit line select signal BSLo is input to the gate of the second NMOS transistor N2.

The third and fourth NMOS transistors N3, N4 are connected in series between the even bit line BLe and the odd bit line BLo. An even bit line discharge signal DISCHe and an odd bit line discharge signal DISCHo are input to the gates of the third and fourth NMOS transistors N3, N4, respectively. Further, a variable voltage VIRPWR is input to a node at which the third and fourth NMOS transistors N3, N4 are connected.

The variable voltage VIRPWR is used to input a power source voltage to a bit line for program inhibition in a program operation or supplies voltage of 0V when a precharged bit line is discharged.

The fifth NMOS transistor N5 is connected between the node K1 and a sensing node SO. A sensing control signal PBSENSE is input to the gate of the fifth NMOS transistor N5. The fifth NMOS transistor N5 is turned on or off in response to a voltage level of the sensing control signal PBSENSE, a bit line voltage, and a voltage state of the sensing node SO, thus reflecting the bit line voltage state in the sensing node SO.

The PMOS transistor P is connected between a power source voltage and the sensing node SO. A precharge control signal PRECH_N is input to the gate of the PMOS transistor P.

The sixth and seventh NMOS transistors N6, N7 are connected between the sensing node SO and a ground node. A first data transfer signal TRANC is input to the gate of the sixth NMOS transistor N6. Further, a node QC is connected to the gate of the seventh NMOS transistor N7.

The eighth NMOS transistor N8 is connected between the node QC and a node K2. A first reset signal CRST is input to the gate of the eighth NMOS transistor N8. The ninth NMOS transistor N9 is connected between a node QC_N and the node K2. A first set signal CSET is input to the gate of the ninth NMOS transistor N9.

The first and second inverters IN1, IN2 are connected between the node QC and the node QC_N in a latch circuit fashion, thus constituting a first latch L1.

The tenth NMOS transistor N10 is connected between the sensing node SO and a node QM_N. A second data transfer signal TRANM is input to the gate of the tenth NMOS transistor N10.

The eleventh NMOS transistor N11 is connected between a node QM and the node K2, and the twelfth NMOS transistor N12 is connected between the node QM_N and the node K2. Further, a second reset signal MRST and a second set signal MSET are input to the gates of the eleventh and twelfth NMOS transistors N11, N12, respectively.

The third and fourth inverters IN3, IN4 are connected between the node QM and the node QM_N in a latch circuit fashion, thus constituting a second latch L2.

The thirteenth and fourteenth NMOS transistors N13, N14 are connected in series between the sensing node SO and a ground node. A third data transfer signal TRANT is input to the gate of the thirteenth NMOS transistor N13. To the gate of the fourteenth NMOS transistor N14 is connected a node QT.

The fifteenth NMOS transistor N15 is connected between the sensing node SO and the node QT. An inversion signal TRANT_N of the third data transfer signal TRANT is input to the gate of the fifteenth NMOS transistor N15.

The sixteenth NMOS transistor N16 is connected between the sensing node SO and a node QT_N. A control signal BCPGM is input to the gate of the sixteenth NMOS transistor N16.

The seventeenth NMOS transistor N17 is connected between the node QT and the node K2, and the eighteenth NMOS transistor N18 is connected between the node QT_N and the node K2. Further, a third reset signal TRST and a third set signal TSET are input to the gates of the seventeenth and eighteenth NMOS transistors N17, N18, respectively.

The fifth and sixth inverters IN5, IN6 are connected between the node QT and the node QT_N in a latch circuit fashion, thus forming a third latch L3.

Further, the nineteenth NMOS transistor N19 is connected between the node K2 and a ground node. To the gate of the nineteenth NMOS transistor N19 is coupled the sensing node SO.

The verification unit 229 is connected between the node QC_N and the node QM and outputs a program verification signal. A detailed circuit of the verification unit 229 is omitted.

Although the page buffer 221 shown in FIG. 2B includes a data input unit for inputting data through the node QC and the node QC_N and a data output unit for outputting latched data through the node QC_N, the data input unit and the data output unit are not shown in the embodiment of the present invention.

Hereinafter, a method of programming test bits into the entire pages of a memory block using the page buffer as shown in FIG. 2B and outputting data on a memory-block basis in order to determine a fail status is described.

Figure 3:
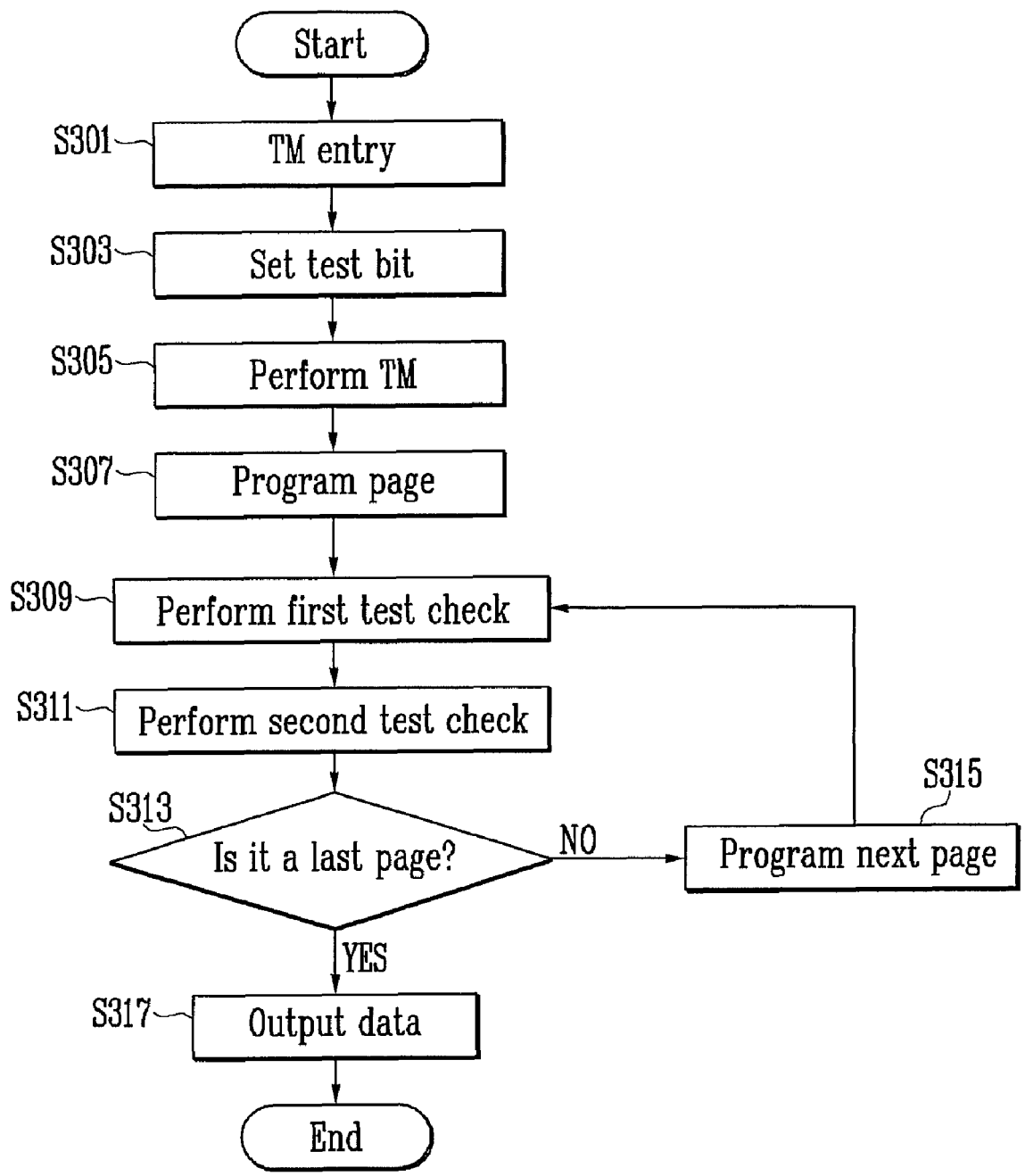
FIG. 3 is a test operation flowchart in accordance with an embodiment of the present invention.

FIG. 3 is a test operation flowchart in accordance with an embodiment of the present invention.

Referring to FIG. 3, in order to test memory cells of the flash memory device 200, an operating mode first changes to test mode (TM) entry (S301) and a test bit is then set (S303).

The reason why the test bit is set is that at the time of a program operation, a Most Significant Bit (MSB) program is not executed, reset is not performed every time a program is performed on a page basis, and only a Least Significant Bit (LSB) program is executed.

That is, it is ensured that the entire memory cells are programmed on a page basis and a page buffer maintains its state without being reset despite a page change. It is also ensured that in the case of a flash memory device including a multi-level cell, only a LSB program is performed.

After the test bit is set, a test progress command is input (S305) and a program is then performed beginning with a first page (S307). At this time, the program is a test program for checking whether the memory cells are normal and is thus performed to program the entire memory cells of a selected page. After the program is performed, data of the memory cells is read into a page buffer for verification.

Next, a first test check process and a second test check process are performed (S309, S311). The first and second test check process are methods of displaying bit lines having faulty (failed) memory cells by moving data between the first and second latches L1, L2 in the page buffer 221.

It is then determined whether a last page has been programmed (S313). If, as a result of the determination, the last page has not been programmed, a next page is programmed (S315). At this time, as mentioned in the above test bit setting process, a reset process of the page buffer 221 for performing the next page program is not carried out.

However, if, as a result of the determination, the last page has been programmed, the data latched to the page buffer 221 is output (S317). A bit line having a fail status is checked based on the output data and repair is then performed on the corresponding bit line.

The test operation of FIG. 3 is described below with reference to FIG. 2B by taking an actual data state as an example.

First, of the first and third latch L1 to L3 of the page buffer 221, only the first and second latches L1, L2 are used in the test operation.

After the test bit is set as shown in FIG. 3, data to be programmed is loaded onto the first latch L1 of the page buffer 221. The operation results can be classified into three cases; a case (A) in which a memory cell should be programmed, a case (B) in which a memory cell should be program-inhibited, and a case (C) in which a memory cell should be programmed, but is not programmed due to a fail status.

Accordingly, the states of the nodes of the first and second latches of the page buffer 221 after such test bit setting can be represented as in the following Table 1.

TABLE 1

| | Node | | | | |
|---|---|---|---|---|---|
| | QC_N | | | QM_N | |
| | Normal cell | | | Normal cell | |
| Program | Program-inhibited | Faulty cell Program | Program | Program-inhibited | Faulty cell Program |
| | | Cases | | | |
| A | B | C | A | B | C |
| Data loading 0 | 1 | 0 | X | X | X |

Data of the page buffer 221 set as above is programmed into a first page, and a program verification operation is performed on the second latch L2. The following Table 2 shows the states of the nodes after program verification.

TABLE 2

| | | Node | | | | |
|---|---|---|---|---|---|---|
| | | QC_N | | | QM_N | |
| | Normal cell | | | Normal cell | | |
| Cases | Program | Program-inhibited | Faulty cell Program | Program | Program-inhibited | Faulty cell Program |
| | A | B | C | A | B | C |
| Data loading | 0 | 1 | 0 | X | X | X |
| Program verification | 0 | 1 | 0 | 1 | 1 | 0 |

As can be seen from Table 2, in the case of the normal cell, after program verification is performed, the node QM_N becomes a data state '1'. However, in the case of the abnormal faulty cell, the node QM_N becomes a data state '0'.

After verification is performed as above, the first test check process (S309) is carried out. The test check process is performed in order to move data of the first latch L1 to the second latch L2 without resetting. At this time, a command 30H may be used.

FIG. 4A is a timing diagram showing the first test check process of FIG. 3.

Referring to FIG. 3, in order to perform a first test check process, first, the precharge control signal PRECH_N of a low level is input in order to turn on the PMOS transistor P, thus precharging the sensing node SO with a high level.

The first data transfer signal TRANC is then input to thereby change the voltage level of the sensing node SO according to the data state of the node QC. The second set signal MSET of a high level is input to thereby change the data state of the node QM_N.

That is, if the sixth NMOS transistor N6 is turned on with the sensing node SO being precharged, the sensing node SO is changed according to the state of the node QC. When the node QC is in the state '1', the seventh NMOS transistor N7 is turned on, so voltage precharged to the sensing node SO is drained to the ground node and the state of the sensing node SO becomes '0'.

When the node QC is in the state '0', the seventh NMOS transistor N7 keeps turned off, so the state of the precharged sensing node SO keeps '1'.

When the sensing node SO is in the state '1', the nineteenth NMOS transistor N19 is turned on, so the node K2 is connected to the ground node. When the sensing node SO is in the state '0', the nineteenth NMOS transistor N19 is turned off.

Further, when the second set signal MSET of a high level is input, the twelfth NMOS transistor N12 is turned on. When the twelfth NMOS transistor N12 is turned on, the data state of the node QM_N is changed according to the state of the node K2.

In the cases (A) and (C), since the nineteenth NMOS transistor N19 is turned off, the node QM_N keeps its original state '1' or '0'.

However, in the case (B), since the nineteenth NMOS transistor N19 is turned on, the state of the node QM_N changes from '1' to '0'.

Accordingly, the states of the nodes result in the following Table 3.

TABLE 3

| | | Node | | | | |
|---|---|---|---|---|---|---|
| | | QC_N | | | QM_N | |
| | Normal cell | | | Normal cell | | |
| Cases | Program | Program-inhibited | Faulty cell Program | Program | Program-inhibited | Faulty cell Program |
| | A | B | C | A | B | C |
| Data loading | 0 | 1 | 0 | X | X | X |
| Program verification | 0 | 1 | 0 | 1 | 1 | 0 |
| First test check | 0 | 1 | 0 | 1 | 0 | 0 |

Next, the second test check process (S311) is performed as follows.

Figure 4B:
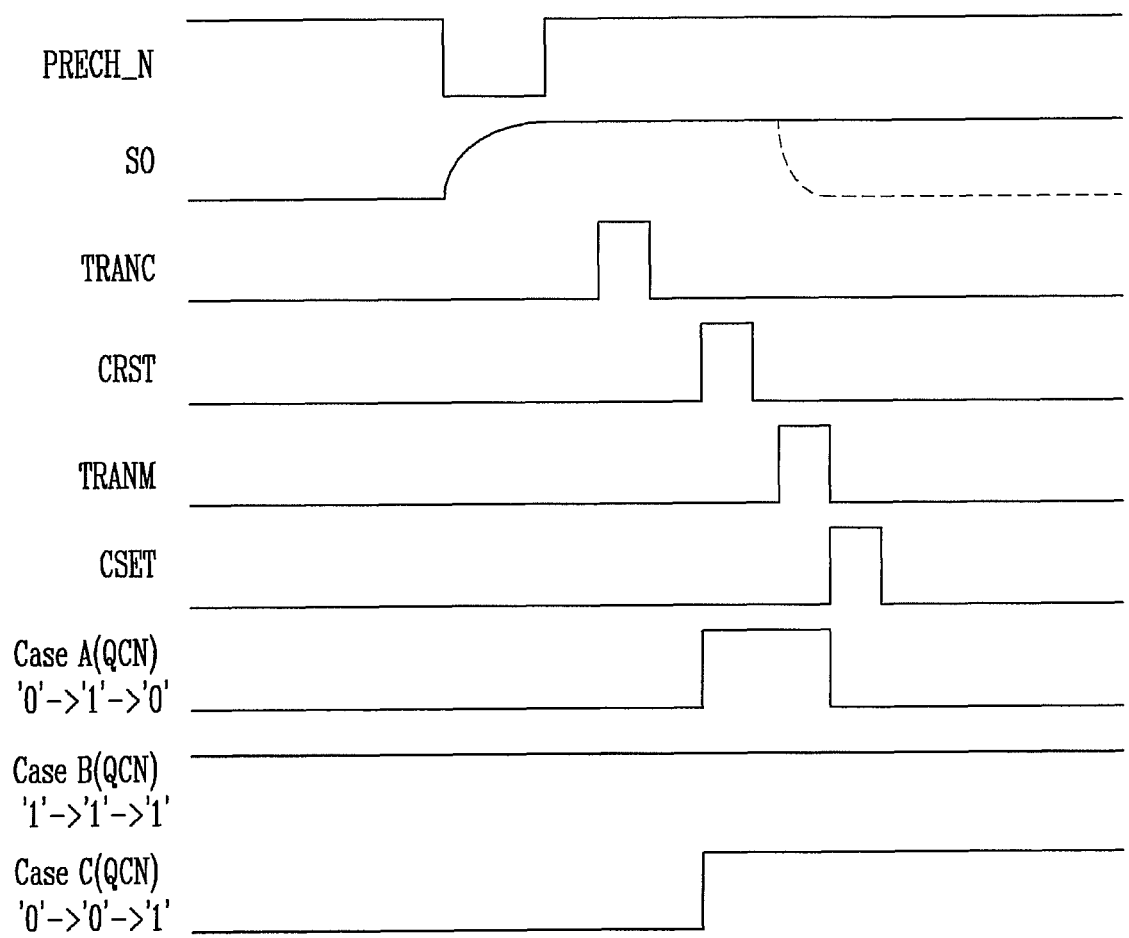
FIG. 4B is a timing diagram showing a second test check process of FIG. 3.

FIG. 4B is a timing diagram showing a second test check process of FIG. 3.

Referring to FIG. 4B, in the state in which the first test check process (S309) is finished, the node states of the first and second latches L1, L2 become ones shown in Table 3. The first latch L1 is first reset. To this end, the sensing node SO is precharged in response to the precharge control signal PRECH_N, and the first reset signal CRST is applied, thereby making the state of the node QC_N '1'.

Further, when the second data transfer signal TRANM of a high level is applied, the sensing node SO is changed according to the state of the node QM_N. Subsequently, when the first set signal CSET of a high level is applied, the state of the node QC_N is changed.

That is, the node QC_N reset to the state '1' changes to the state '0' when the node QM_N is in the state '1'. Further, when the node QM_N is in the state '0', the node QC_N maintains the state '1'. After the above test is finished, a program of a second page is performed. At this time, the program is performed without resetting the page buffer in the state in which data is latched in the node QC_N. The processes (S309 to S313) of FIG. 3 are repeatedly performed up to the last page of the memory block.

The following Table 4 shows the states of the nodes according to the second test check executed.

TABLE 4

| | | Node | | | | |
|---|---|---|---|---|---|---|
| | | QC_N | | | QM_N | |
| | Normal cell | | | Normal cell | | |
| Cases | Program | Program-inhibited | Faulty cell Program | Program | Program-inhibited | Faulty cell Program |
| | A | B | C | A | B | C |
| Data loading | 0 | 1 | 0 | X | X | X |
| Program verification | 0 | 1 | 0 | 1 | 1 | 0 |

TABLE 4-continued

| | Node | | | | | |
|---|---|---|---|---|---|---|
| | QC_N | | | QM_N | | |
| | Normal cell | | | Normal cell | | |
| | Program | Program-inhibited | Faulty cell Program | Program | Program-inhibited | Faulty cell Program |
| Cases | A | B | C | A | B | C |
| First test check | 0 | 1 | 0 | 1 | 0 | 0 |
| First latch reset | 1 | 1 | 1 | 1 | 0 | 0 |
| Second test check | 0 | 1 | 1 | 1 | 0 | 0 |

The first and second test check processes are performed subsequently to the program of the first page. When the state of the node QC_N is '1', it is determined as a fail status and, therefore, a state bit screen operation can be performed.

Further, in the case of a test program, the entire memory cells are programmed. Thus, the node QC_N programs a first page, and the node QC_N of the page buffer 221, which is connected to a bit line having at least one faulty memory cell although the test program is performed on a second page, a third page, . . . , up to a last page of the memory block by reflecting the results of the first and second test checks without change, maintains the state '1'.

Accordingly, after the test program is performed on the entire pages of the memory block and the first and second test checks are performed, data of the node QC_N of the page buffer 221 is finally output, so that a bit line connected to the page buffer 221 having the state '1' is screened and repair is then performed on the bit line.

After a test bit program is performed on the entire memory blocks through the above process, data reading is performed only once. Accordingly, the test time can be shortened.

As described above, in accordance with the method of testing a nonvolatile memory device according to the present invention, after test bits are all programmed into the entire memory blocks, page buffers are scanned. Accordingly, the test time can be reduced.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of testing a nonvolatile memory device, the method comprising:
    performing a test bit setting;
    programming a first page using data set by the test bit setting, and storing a fail status bit in a page buffer, which is connected to a first bit line having a fail status, based on a verification result of the test program;
    performing a test program and a verification on a second page based on a test program and a fail status bit storage result of a preceding page, and storing a fail status bit in the page buffer, which is connected to a second bit line having a fail status, based on a verification result of the test program and verification; and
    after a test program, a verification, and a fail status bit setting with respect to the entire pages of a memory block are completed, outputting data of the page buffer.

2. The method of claim 1, wherein the test bit setting includes:
    setting not to reset the page buffer when test programs of the remaining pages other than the first page are performed,
    setting only a first bit program to be performed on the entire pages, and
    setting a test bit, which enables a program to be performed on the entire memory cells.

3. The method of claim 1, wherein the test program of the first page includes:
    programming a test bit, which is input to a first latch of the page buffer connected to the first page in the test bit setting, into the first page; and
    storing the program verification result in a second latch of the page buffer.

4. The method of claim 3, wherein the storage of the fail status bit includes:
    changing a data state of the second latch according to data stored in the first latch;
    resetting the first latch; and
    changing a data state of the first latch according to a data state stored in the second latch.

5. The method of claim 4, wherein the test programs of the remaining pages other than the first page are respectively performed according to the data state of the first latch in accordance with a test program and a fail status bit storage result of a preceding page.

6. The method of claim 5, wherein the output of the data of the page buffer includes outputting data of the first latch.

7. The method of claim 6, wherein a fail status bit line is determined and repair is performed, based on the output data.

8. A method of testing a nonvolatile memory device, the method comprising:
    in performing a test program and verification on the entire pages of a memory block, programming an input test bit with respect to a first page, and performing a test program and verification based on test bit program and fail status bit storage results of preceding pages and fail status bit storage with respect to each of subsequent pages; and
    after a test program and verification and fail status bit setting are completed with respect to a last page of the memory block, outputting data of a page buffer.

9. The method of claim 8, wherein in the test program, a test program and verification of a first page includes:
    inputting a test bit to a first latch of the page buffer and performing program and verification; and
    storing the program verification result in a second latch of the page buffer.

10. The method of claim 9, wherein fail status bit setting according to the test verification result of the first page is performed, and program, verification and fail status bit storage are performed with respect to each of the subsequent pages according to set fail status bit data.

11. The method of claim 8, wherein the test program includes performing only a program on a first logical page of a memory cell.

12. The method of claim 8, wherein a fail status bit line is determined and repair is performed, based on the output data.

13. A method of testing a nonvolatile memory device, the method comprising:
    performing test bit setting;
    performing a first page program using data set by the test bit setting, and fixing data of a page buffer, which is connected to a first bit line having a fail status, to a fail status bit based on a verification result of the test program;

performing a test program and verification of a second page with respect to the remaining bit lines other than a bit line in which data of a page buffer is fixed to a fail status bit based on test program and fail status bit storage results of preceding page buffers, and storing a fail status bit in the page buffer connected to a second bit line having a fail status based on the verification result; and after the test program and verification and the fail status bit fixing with respect to the entire pages of a memory block are completed, outputting data of the page buffer.

* * * * *